United States Patent
Raley et al.

(10) Patent No.: US 9,673,059 B2
(45) Date of Patent: Jun. 6, 2017

(54) METHOD FOR INCREASING PATTERN DENSITY IN SELF-ALIGNED PATTERNING INTEGRATION SCHEMES

(71) Applicant: Tokyo Electron Limited, Minato-ku, Tokyo (JP)

(72) Inventors: Angelique Raley, Mechanicville, NY (US); Akiteru Ko, Schenectady, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/009,013

(22) Filed: Jan. 28, 2016

(65) Prior Publication Data

US 2016/0225640 A1    Aug. 4, 2016

Related U.S. Application Data

(60) Provisional application No. 62/110,847, filed on Feb. 2, 2015.

(51) Int. Cl.
*H01L 21/311* (2006.01)
*H01L 21/033* (2006.01)
(Continued)

(52) U.S. Cl.
CPC .. *H01L 21/31144* (2013.01); *H01J 37/32082* (2013.01); *H01L 21/0337* (2013.01);
(Continued)

(58) Field of Classification Search
CPC ............. H01L 21/0337; H01L 21/0338; H01L 21/31144; H01L 21/3086; H01L 21/3088; H01L 21/31116; H01L 21/32139
See application file for complete search history.

(56) References Cited

U.S. PATENT DOCUMENTS 5,024,716 A    6/1991    Sato
6,063,688 A *  5/2000    Doyle .................. B82Y 10/00
                                              257/E21.038
(Continued)

FOREIGN PATENT DOCUMENTS

JP    2014-72226 A    4/2014
JP    2014-145634 A   8/2014

OTHER PUBLICATIONS

J. Dendooven, et al., "Conformality of Al2O3 and AlN Deposited by Plasma-Enhanced Atomic Layer Deposition," Electrochem. Soc. 2010 157(4): G111-G116; doi:10.1149/1.3301664 (2 pages).
(Continued)

*Primary Examiner* — Jaehwan Oh
(74) *Attorney, Agent, or Firm* — Rothwell, Figg, Ernst & Manbeck, P.C.

(57) ABSTRACT

Provided is a method for increasing pattern density of a structure on a substrate using an integration scheme comprising: providing a substrate having a patterned layer comprising a first mandrel and an underlying layer; performing a first conformal spacer deposition creating a first conformal layer; performing a first spacer reactive ion etch (RIE) process on the first conformal layer, creating a first spacer pattern; performing a first mandrel pull process removing the first mandrel; performing a second conformal spacer deposition creating a second conformal layer; performing a second RIE process creating a second spacer pattern, the first spacer pattern acting as a second mandrel; performing a second mandrel pull process removing the first spacer pattern; and transferring the second spacer pattern into the underlying layer; where the integration targets include patterning uniformity, pulldown of structures, slimming of structures, and gouging of the underlying layer.

19 Claims, 18 Drawing Sheets

(51) Int. Cl.
*H01L 21/3213* (2006.01)
*H01J 37/32* (2006.01)

(52) U.S. Cl.
CPC .. *H01L 21/31116* (2013.01); *H01L 21/31122* (2013.01); *H01L 21/31138* (2013.01); *H01L 21/32137* (2013.01)

(56) References Cited

U.S. PATENT DOCUMENTS

| | | | | |
|---|---|---|---|---|
| 7,291,560 | B2* | 11/2007 | Parascandola | H01L 21/0337 216/41 |
| 8,338,304 | B2* | 12/2012 | Zhou | H01L 21/3088 257/618 |
| 9,123,659 | B1* | 9/2015 | Fu | H01L 21/3086 |
| 9,165,765 | B1* | 10/2015 | Raley | H01L 21/0234 |
| 9,379,017 | B1* | 6/2016 | Sung | |
| 2002/0043690 | A1 | 4/2002 | Doyle et al. | |
| 2002/0081504 | A1* | 6/2002 | Kong | G03F 7/40 430/18 |
| 2006/0281266 | A1* | 12/2006 | Wells | H01L 21/0337 438/299 |
| 2007/0049040 | A1* | 3/2007 | Bai | H01L 21/0337 438/712 |
| 2007/0113788 | A1 | 5/2007 | Nozawa et al. | |
| 2008/0057692 | A1* | 3/2008 | Wells | H01L 21/0337 438/597 |
| 2010/0295021 | A1* | 11/2010 | Chang | H01L 27/1203 257/24 |
| 2011/0031473 | A1* | 2/2011 | Chang | B82Y 10/00 257/24 |
| 2011/0057562 | A1 | 3/2011 | Chen et al. | |
| 2013/0306598 | A1* | 11/2013 | Ko | G03F 7/36 216/67 |
| 2014/0357084 | A1* | 12/2014 | Ko | H01L 21/0337 438/696 |
| 2016/0111297 | A1* | 4/2016 | Chen | H01L 21/0337 438/692 |
| 2016/0163555 | A1* | 6/2016 | Jang | H01L 21/3086 438/587 |

OTHER PUBLICATIONS

H. B. Profijt, et al., "Plasma-Assisted Atomic Layer Deposition: Basics, Opportunities, and Challenges," Review Article, 050801-1 J. Vac. Sci. Technol. A 29(5), Sep./Oct. 2011, VC 2011 American Vacuum Society (26 pages).

J. Dekker, et al., "Inductively coupled plasma etching of amorphous Al2O3 and TiO2 mask layers grown by atomic layer deposition," J. Vac. Sci. Technol. B 24(5), Sep./Oct. 2006, 2006 American Vacuum Society, pp. 2350-2355.

U.S. Appl. No. 14/299,752, O'Meara et al., "Material Conversion After Etch to Form Features Thinner Than Current Photolithography," filed Jun. 9, 2014.

Office Action mailed Dec. 19, 2016 in corresponding Taiwan Patent Application No. 105103080 (with an English translation) (19 pages).

Office Action mailed Feb. 28, 2017 in corresponding Japanese Patent Application No. 2016-017285 (with an English translation) (15 pages).

* cited by examiner

US 9,673,059 B2

METHOD FOR INCREASING PATTERN DENSITY IN SELF-ALIGNED PATTERNING INTEGRATION SCHEMES

BACKGROUND OF THE INVENTION

Field of Invention

The invention relates to a method of performing a sequence of semiconductor patterning operations on a substrate and specifically to increases the pattern density without requiring several underlying layers.

Description of Related Art

In semiconductor manufacturing patterning of a film on a substrate can be achieved through several methods that have evolved with time to follow Moore's law. The first method is conventional lithography which can no longer be used alone to achieve advanced nodes critical dimensions (CD).

Double patterning is the technique used to create hard mask features smaller than photolithographic capabilities by using spacer deposition to define feature dimensions. Typical double patterning (DP) techniques require a sequence of deposition over a mandrel, etch to form the spacer and another etch to remove the mandrel, with both deposition and etch tools required. There are some spatial limitations inherent in the conventional DP technique due to deposition 'thin-ness' limitations and pitch of the features from mandrel formation limitations.

It is now combined with additional techniques such as self-aligned double patterning or DSA (directed self-assembly) to achieve the required CD. These methods can become costly and add several steps to the process. Advanced extreme ultra violet (EUV) lithography should be able to alleviate some of these issues once available but the constant drive to smaller CD will remain a challenge for the future technologies to come. Current techniques require sequences of deposition of layers and etching of patterns on these layers that are expensive. There is a need for integration schemes that can achieve the same increase of densities without requiring several underlying layers to achieve higher pattern densities in performing self-aligned quadruple patterning (SAQP) or other higher density integration schemes.

SUMMARY OF THE INVENTION

Provided is a method for increasing pattern density of a structure on a substrate using an integration scheme, the method comprising: the integration scheme configured to meet integration targets, the method comprising: providing a substrate having a patterned layer, the patterned layer comprising a first mandrel and an underlying layer; performing a first conformal spacer deposition, the deposition creating a first conformal layer above the patterned layer; performing a first spacer reactive ion etch (RIE) process on the first conformal layer, the RIE process creating a first spacer pattern; performing a first mandrel pull process, the first mandrel pull process removing the first mandrel; performing a second conformal spacer deposition, the deposition creating a second conformal layer; performing a second RIE process on the second conformal layer, the RIE process creating a second spacer pattern, the first spacer pattern acting as a second mandrel; performing a second mandrel pull process, the second mandrel pull process removing the first spacer pattern; and transferring the second spacer pattern into the underlying layer; wherein the integration targets include patterning uniformity, pulldown of structures, slimming of structures, and gouging of the underlying layer.

In another embodiment, a method for increasing pattern density of a structure on a substrate using an integration scheme, the integration scheme configured to meet integration targets, the method comprising: providing a substrate in a processing chamber, the substrate having a patterned layer, the patterned layer comprising a mandrel and an underlying layer; performing a first conformal spacer deposition using silicon nitride, the deposition creating a first conformal layer above the patterned layer; performing a first spacer reactive ion etch (RIE) process on the first conformal layer, the RIE process creating a first spacer pattern; performing a second conformal spacer deposition, the deposition creating a second conformal layer; performing a second RIE process on the second conformal layer, the RIE process creating a second spacer pattern, performing a first spacer pattern pull process, the first spacer pattern pull process removing the first spacer pattern; and transferring a pattern into the underlying layer using two masks, the two masks comprising the mandrel and the second spacer pattern; wherein the integration targets include patterning uniformity, pulldown of structures, slimming of structures, and gouging of the underlying layer.

BRIEF DESCRIPTION OF THE DRAWINGS

FIG. 3A is a schematic representation of providing a substrate having a patterned layer and the patterned layer comprises a first conformal layer, a first mandrel, and an underlying layer. FIG. 3B is a schematic representation of an integration operation for performing a first spacer reactive ion etch (RIE) process on the first conformal layer. FIG. 3C is a schematic representation of an integration operation for performing a first mandrel pull process. FIG. 3D is a schematic representation of an integration operation for performing a second conformal spacer deposition. FIG. 3E is a schematic representation of an integration operation for performing a second RIE process on the second conformal layer. FIG. 3F is a schematic representation of an integration operation for performing a second mandrel pull process. FIG. 3G is a schematic representation of an integration operation for transferring the second spacer pattern into the underlying layer. FIG. 3H is a schematic representation of an integration operation for an optional cleaning process where the remaining portion of the second mandrel is removed.

FIG. 4A is a schematic representation of an integration operation for providing a substrate having a patterned layer where the patterned layer comprises a first conformal layer, a mandrel, and an underlying layer. FIG. 4B is a schematic representation of an integration operation for performing a first spacer RIE process on the first conformal layer. FIG. 4C is a schematic representation of an integration operation for performing a second conformal spacer deposition. FIG. 4D is a schematic representation of an integration operation for a second RIE process on the second conformal layer. FIG. 4E is a schematic representation of an integration operation for performing a first spacer pattern pull. FIG. 4F is a schematic representation of an integration operation for transferring the pattern into the underlying layer, the pattern using two different masks comprising the mandrel and the second spacer pattern. FIG. 4G is a schematic representation of an integration operation for an optional cleaning process where the remaining portions of the mandrel and second spacer pattern are removed.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1A:
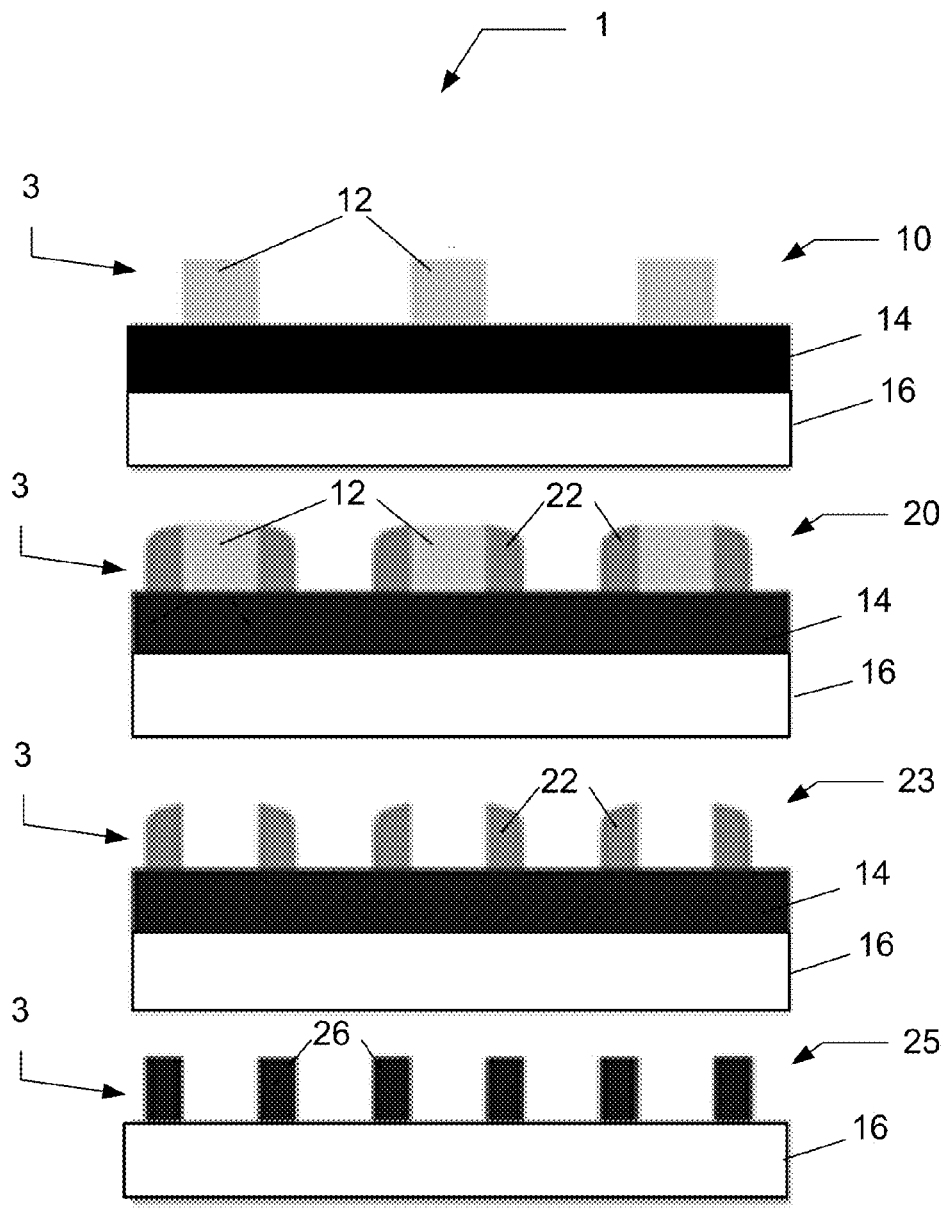
FIG. 1A depicts a schematic illustrating exemplary prior art for performing an integration scheme for self-aligned double patterning.

FIG. 1A depicts a schematic 1 illustrating an exemplary prior art method for performing an integration scheme for conventional self-aligned double patterning. Integration schematic 10 depicts patterned layer 3 on a substrate 16 where a mandrel 12 is disposed on top of a target layer 14. Integration schematic 20 depicts the results of a conformal deposition and subsequent reactive ion etch (RIE) processes on the patterned layer 3 on target layer 14 disposed on substrate 16, the processes generating spacers 22 and the mandrel 12. Integration schematic 23 depicts the results of a mandrel pull process on the patterned layer 3 where the mandrel 12 is removed, leaving the spacers 22. Integration schematic 25 depicts the results of transferring the patterned layer 3 comprising the spacer pattern 26 into the target layer 14, generating a double-density pattern 26 using the target layer 14 on top of substrate 16.

Figure 1B:
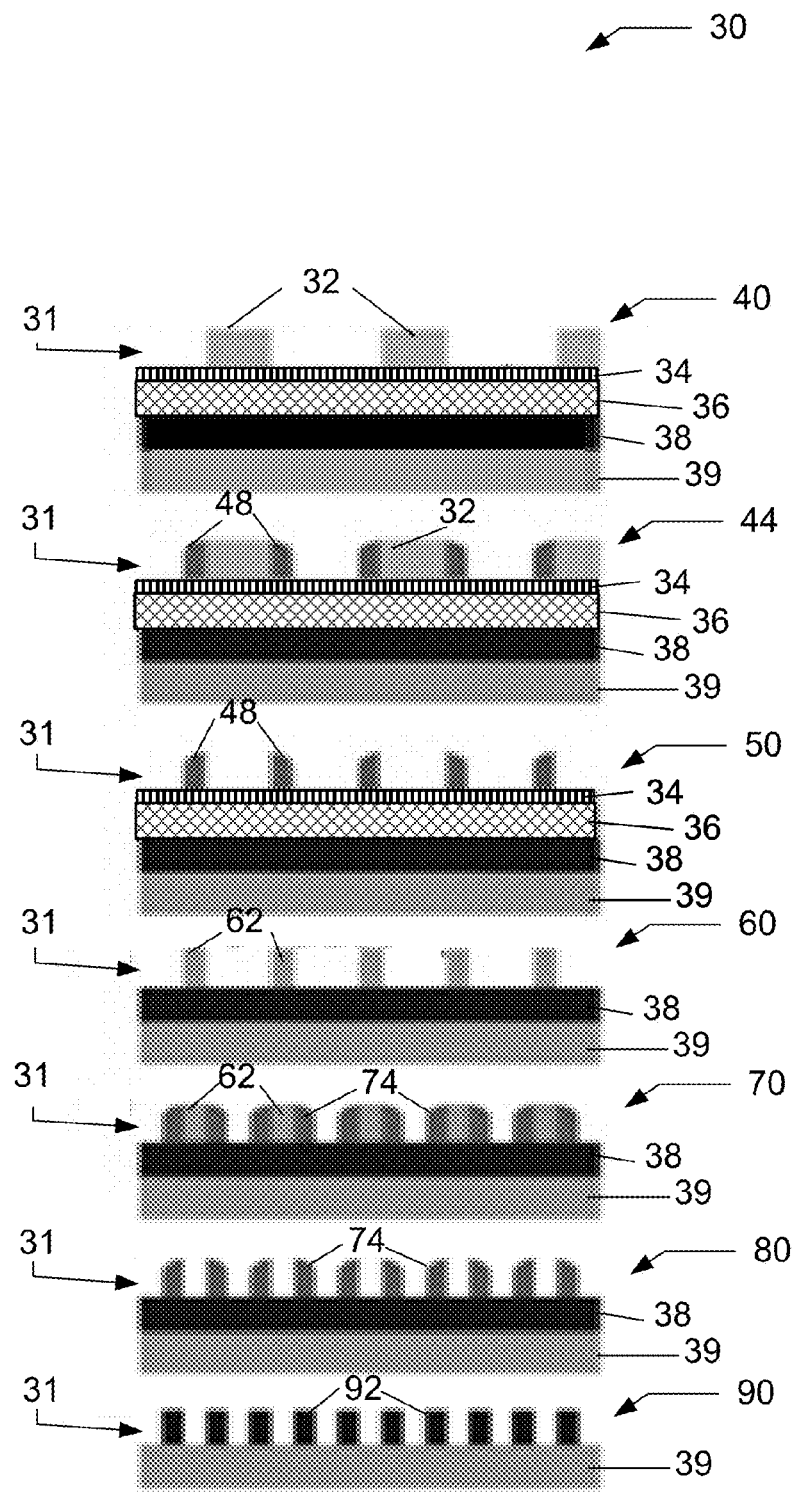
FIG. 1B depicts a schematic illustrating another exemplary prior art method for performing another integration scheme for another self-aligned quadruple patterning.

FIG. 1B depicts a schematic 30 illustrating another exemplary prior art method for performing another integration scheme for a conventional self-aligned quadruple patterning. Integration scheme 40 depicts patterned layer 31 including a mandrel 32 on top of target layers 34 and 36, the target layers 34 and 36 disposed on top of the underlying layer 38 and substrate 39. Integration scheme 44 depicts the results of a conformal deposition and subsequent RIE processes on patterned layer 31 including the mandrel 32 and generated first spacer 48. Integration scheme 50 depicts the results of a mandrel pull process on the patterned layer 31 where the mandrel 32 is removed, leaving the first spacer 48. Integration scheme 60 depicts the results of a process on patterned layer 31 after transferring the first spacer 48 into the target layers 34 and 36, creating a first spacer pattern 62. Integration scheme 70 depicts the results of a conformal deposition and subsequent RIE process on patterned layer 31 generating a second spacer pattern 74 with the first spacer pattern 62 as a mandrel. Integration scheme 80 depicts the result of a mandrel pull process on patterned layer 31 where the first spacer pattern 62 is removed and the second spacer pattern 74 is retained. Integration scheme 90 depicts the results of transferring the second spacer pattern 74 into underlying layer 38 generating a quadruple density pattern 92 on top of the substrate 39 in the patterned layer 31.

Figure 2A:
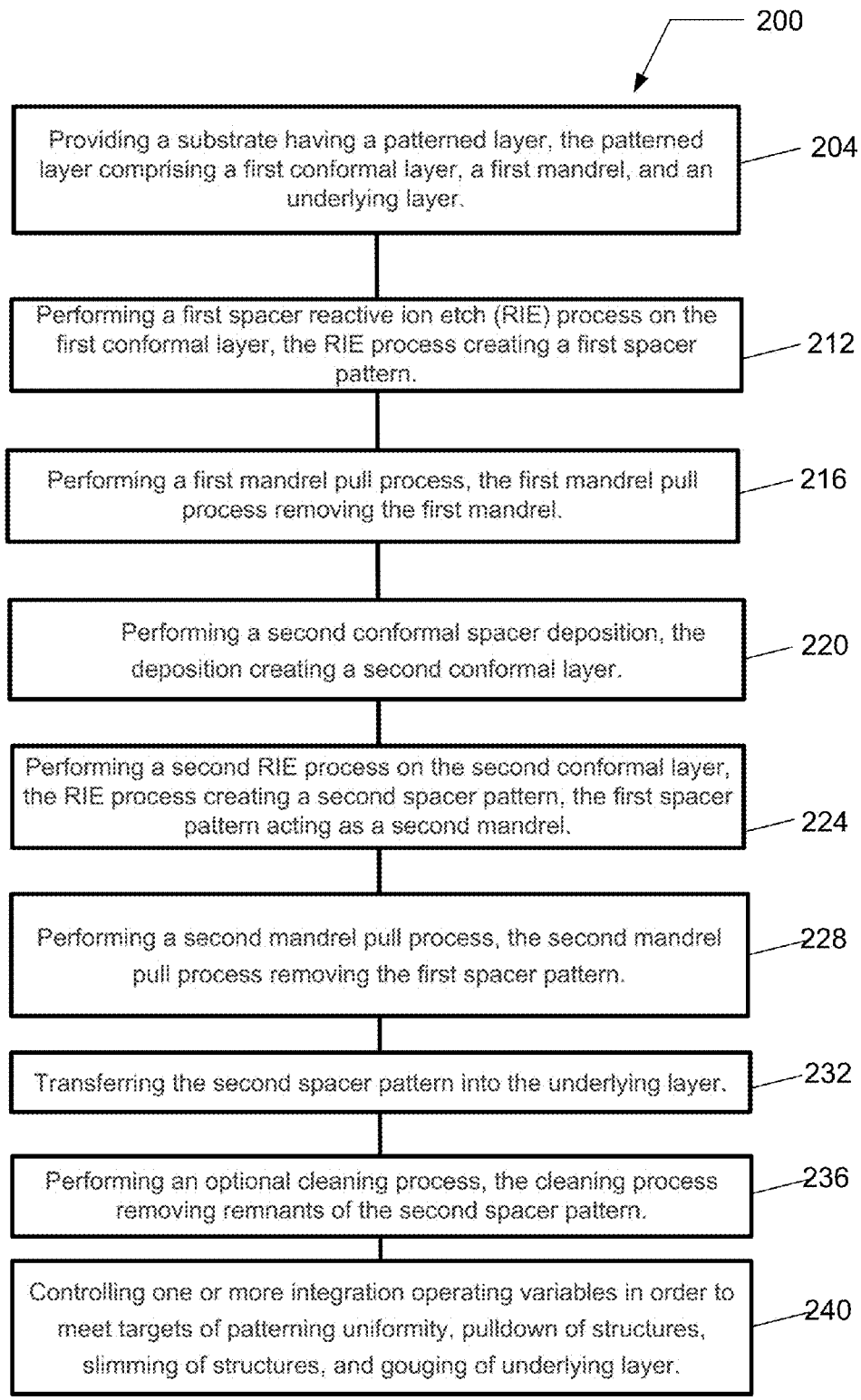
FIG. 2A depicts a flow chart illustrating an exemplary method for performing an integration scheme to form a structure with increased pattern density in an embodiment of the present invention.

FIG. 2A depicts a flow chart 200 illustrating an exemplary method for performing an integration scheme to form a structure with increased pattern density where the pattern is not transferred into the underlying layer throughout the integration sequence except at the end. Since these target layers are not used, significant savings can be obtained by eliminating the need for the target layers and the time needed to deposit these layers onto the substrate. Elimination for the need of separate target layers is made possible by implementing tight process control and utilizing advances in RIE etchers and atomic layer deposition (ALD) techniques. Integration targets include at least patterning uniformity (uniformity), pulldown of structures (pulldown), slimming of structures (slimming), and gouging of the underlying layer (gouging). The inventors found out that (a) tight process controls, (b) concurrent optimization of selected two or more integration operating variables, and (c) use of new advances in RIE etchers and atomic layer deposition (ALD) techniques make the elimination of target layers possible and sustainable while achieving the desired patterning density of the application.

FIG. 2A will be discussed together with FIG. 3A, FIG. 3B, FIG. 3C, FIG. 3D, FIG. 3E, FIG. 3F, FIG. 3G, and FIG. 3H. Referring to FIG. 2A, in operation 204, a substrate 304 having a patterned layer 301 is provided in the processing chamber, the patterned layer 301 comprising a first conformal layer 308, a first mandrel 306, and an underlying layer 302. The mandrel 306 can comprise silicon, the first conformal layer 308 can comprise silicon nitride, and the underlying layer can comprise TiO2, Al2O3, or a thin oxide ALD layer. The first conformal spacer deposition is performed, the deposition creating a first conformal layer above the patterned layer. In operation 212, a first spacer reactive ion etch (RIE) process on the first conformal layer is performed, the RIE process creating a first spacer pattern 309. Minimal gouging is expected in this step and needs to be in the range of 0.05 to 2.50 nm. In operation 216, a first mandrel pull process is performed, the first mandrel pull process removing the first mandrel 306 using HBr/O2 chemistry at 80 mT 500/80 W or Cl2/He at 90 sccm for 85 sec. The pulldown target is a range from 0 to 10 nm. In operation 220, a second conformal spacer deposition is performed, the deposition creating a second conformal layer 342 comprising an ALD oxide. In operation 224, a second RIE process on the second conformal layer 342 is performed, the RIE process creating a second spacer pattern 352, the first spacer pattern 309 acting as a second mandrel. Moderate gouging is acceptable in the range from 1.00 to 5.00 nm. In operation 228, a second mandrel pull process is performed, the second mandrel pull process removing the first spacer pattern 309, using CH3F/O2/Ar, CH3F/H2/Ar or CH3F/H2/He.

In operation 232, the second spacer pattern 352 is transferred into the underlying layer 302 in the patterned layer 301. The patterned layer 301 includes a structure 378 comprising some remnants of the second spacer pattern 352 at the top and a portion from the underlying layer 302 as pattern 374 at the bottom of structure 378. Note that the transfer of the second spacer pattern into the underlying layer is the last operational step of the integration scheme. In operation 236, an optional cleaning process is performed where the remnants of the second spacer pattern 352 on the structure 378 is removed. In operation 240, two or more selected integration operating variables are controlled in one or more or all of the previous operations in order to meet targets of patterning uniformity in the range of −5% to +5%, pulldown in a range of 0.5 to 15.0 nm, slimming in the range of 0.5 to 3.0 nm, and gouging in a range from 0.05 to 5.0 nm, unless a more specific range was stated for the integration step. The two or more integration operating variables in an integration step comprises temperature in the processing chamber, pressure, flow rate of the one or more gases, partial pressure of the gas component of the one or more gases, duration of the integration step, rotation rate of the substrate, and power of the energy used to create the plasma. Other integration operating variables may also be used.

In another embodiment, the mandrel 306 comprises silicon nitride, the first conformal layer 308 comprises a silicon film, CH3F/O2/Ar is used in the first mandrel pull, and the chemicals used in the second mandrel or second spacer structure pull is performed with C4F8/O2/Ar or C4F6/O2/Ar.

In still another embodiment, the mandrel comprises an amorphous carbon layer, the first conformal layer is low temperature ALD oxide, the first RIE process is performed with C4F8/O2/Ar or C4F6/O2/Ar, the first mandrel pull is performed with O2/Ar or CO2/Ar, pure O2, or CO2/O2.

The inventors found out that concurrently optimizing the selected two or more integration operating variables to keep the uniformity, pulldown, slimming, and gouging targets within the acceptable ranges generated the best results. In addition, the inventors found out that pulsing of lower radio frequency (RF) power in capacitively coupled plasma (CCP) etchers enables the reduction of the overall ion energy and yields better pulldown performance. Additional description of advances in atomic layer deposition is included in "J. Dekker, et al., "Inductively Coupled Plasma Etching Of Amorphous AL2O3 And TiO2 Mask Layers Grown By Atomic Layer Deposition", J. Vac. Sci. Technol. B, Vol. 24, No. 5, September/October 2006, the content of which is herein incorporated by reference in its entirety. Moreover, additional description of plasma-enhanced atomic layer deposition is further described by Deduytsche et al., "Conformality Of Al2O3 And AlN Deposited By Plasma-Enhanced Atomic Layer Deposition", J. Electrochem. Soc. 2010, 157(4), G111-116, the content of which is herein incorporated by reference in its entirety.

Figure 2B:
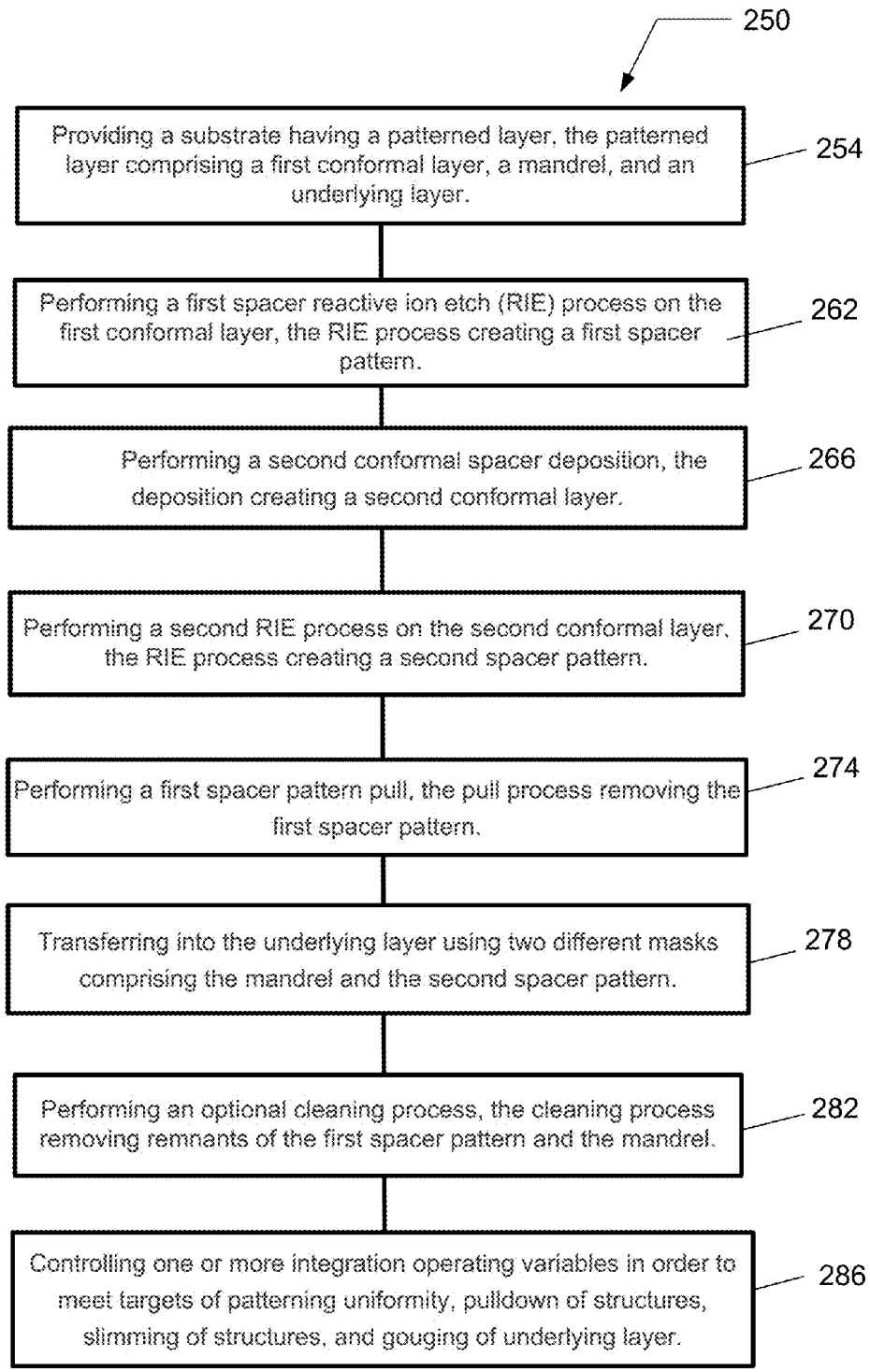
FIG. 2B depicts another flow chart illustrating another exemplary method for performing an integration scheme to form a structure with increased pattern density in another embodiment of the present invention.

FIG. 2B depicts another flow chart 250 illustrating another exemplary method for performing an integration scheme to form a structure with increased pattern density for self-aligned structures where the pattern is not transferred into the underlying layer throughout the integration sequence except at the end. FIG. 2B will be discussed together with FIG. 4A, FIG. 4B, FIG. 4C, FIG. 4D, FIG. 4E, FIG. 4F, and FIG. 4G. Referring to FIG. 2B, in operation 254, a substrate 408 having a patterned layer 401 is provided in the processing chamber, the patterned layer 401 comprising a first conformal layer 402, a mandrel 404 and an underlying layer 406. The first conformal layer 402 comprises silicon nitride, the mandrel 404 comprises silicon while the underlying layer 406 comprises a layer of thin oxide such as titanium oxide, over a layer of titanium nitride, or Al3O3. As mentioned above, conformal spacer deposition processes are known in the art. In operation 262, a first RIE process is performed on the patterned layer 401, the RIE process creating a first spacer pattern 403. As also mentioned above, reactive ion etch processes are known to persons knowledgeable in the art. For a more detailed description of conformal spacer deposition and RIE processes in semiconductor integration schemes, refer to U.S. application Ser. No. 14/299,752 titled MATERIAL PROCESSING TO ACHIEVE SUB-10 NM PATTERNING, filed on Jun. 6, 2013, the content of which is herein incorporated by reference in its entirety.

In operation 266, a second conformal spacer deposition is performed, the deposition creating a second conformal layer 422, the second conformal layer comprising AL2O3 or the like. In operation 270, a second RIE process on the second conformal layer 422 is performed, the RIE process creating a second spacer pattern 423. In operation 274, a first spacer pattern pull is performed, the pull process removing the first spacer pattern 403.

In operation 278, the pattern 451 is transferred into the underlying layer 406 using two different masks comprising the mandrel 404 and the second spacer pattern 423.

In an optional operation 282, a cleaning process is performed, removing the portion of the mandrel 404 and the second spacer pattern 423 and leaving the structure 464 generated from the underlying layer 406.

In operation 282, two or more selected integration operating variables are controlled in order to meet targets of patterning uniformity in the range of −5% to +5%, pulldown in a range of 0.5 to 15.0 nm, slimming in the range of 0.5 to 3.0 nm, and gouging in a range from 0.05 to 5.0 nm, unless a more specific range was stated for the integration step. The two or more integration operating variables in an integration step can comprise temperature in the processing chamber, pressure, flow rate of the one or more gases, partial pressure of the gas component of the one or more gases, duration of the integration step, rotation rate of the substrate, and power of the energy used to create the plasma. Other integration operating variables may also be used.

In another embodiment of the invention described in FIG. 2B, the substrate can comprise silicon oxide; the mandrel can comprise silicon nitride, the chemicals used in the first RIE process can be C4F8 or C4F6 with some O2 and carrier gas Ar or He; the first conformal deposition comprising Al2O3; the second conformal deposition comprising titanium oxide; first spacer RIE using BCl3 or CF4, or Ar; and transfer pattern into underlying layer using resulting silicon nitride mandrel and titanium oxide hard mask.

As mentioned above, the inventors found out that concurrently optimizing the two or more integration operating variables to keep the uniformity, pulldown, slimming, and gouging within the acceptable ranges generated the best results. In addition, the inventors found out that pulsing of lower radio frequency (RF) power in capacitively coupled plasma (CCP) etchers enables the reduction of the overall ion energy and yields better pulldown performance. Additional description of advances in atomic layer deposition is included in "J. Dekker, et al., "Inductively Coupled Plasma Etching Of Amorphous AL2O3 And TiO2 Mask Layers Grown By Atomic Layer Deposition", J. Vac. Sci. Technol. B, Vol. 24, No. 5, September/October 2006, the content of which is herein incorporated by reference in its entirety. Moreover, additional description of plasma-enhanced atomic layer deposition is further described by Deduytsche et al., "Conformality Of Al2O3 And AlN Deposited By Plasma-Enhanced Atomic Layer Deposition", J. Electrochem. Soc. 2010, 157(4), G111-116, the content of which is herein incorporated by reference in its entirety.

Figure 3A:
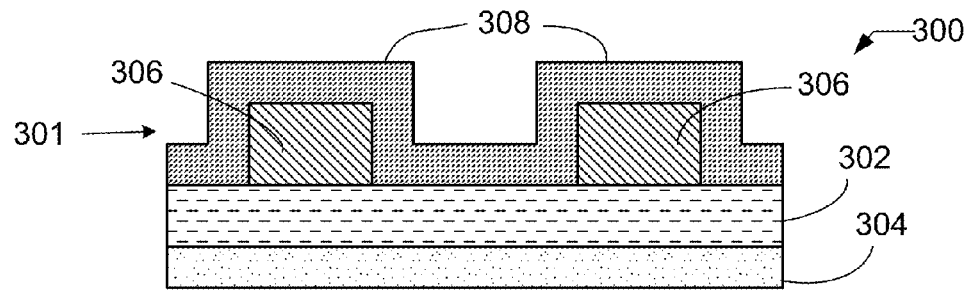
FIGS. 3A, 3B, 3C, 3D, 3E, 3F, 3G, and 3H are schematic representations of integration operations for a self-aligned quadruple patterning (SAQP) scheme.
Figure 3B:
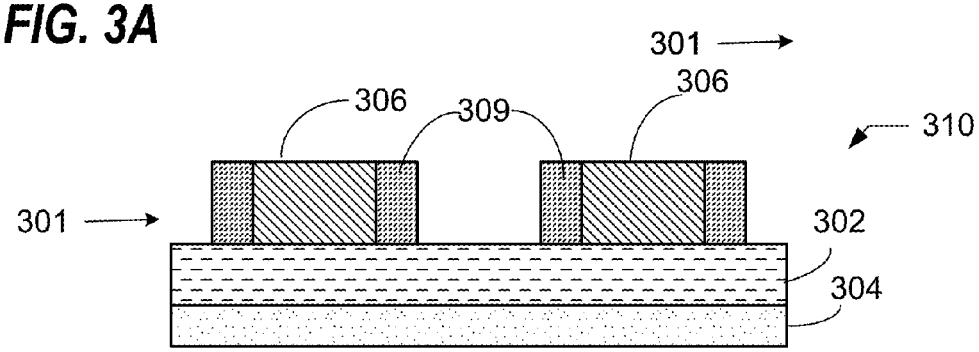
Figure 3C:
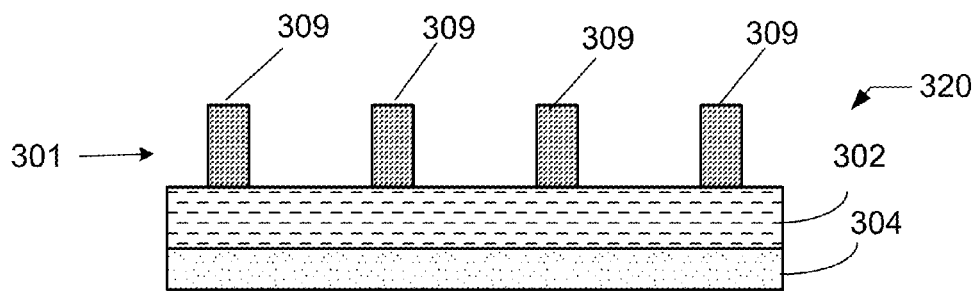
Figure 3D:
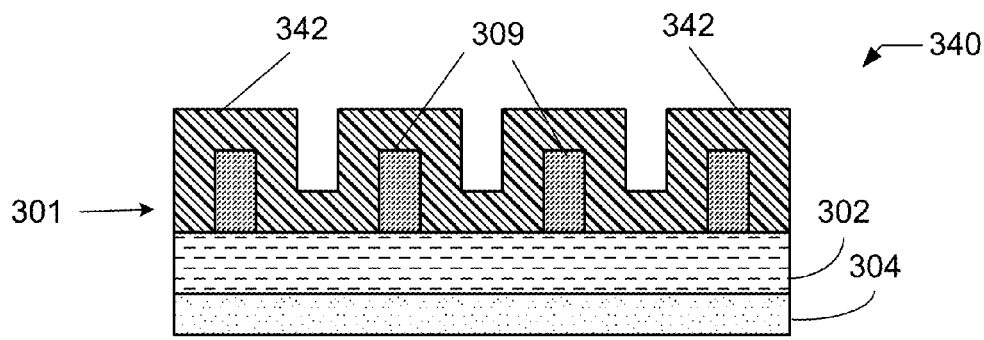
Figure 3E:
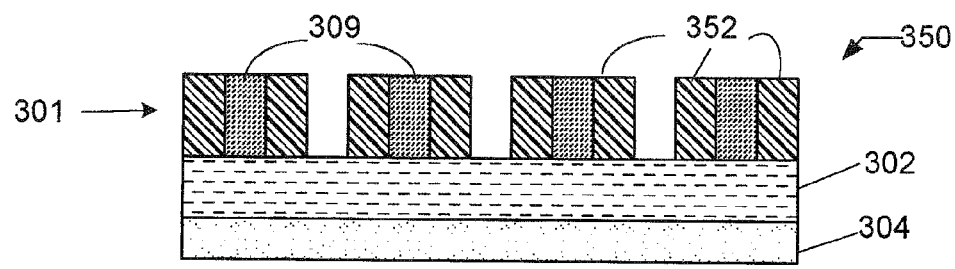
Figure 3F:
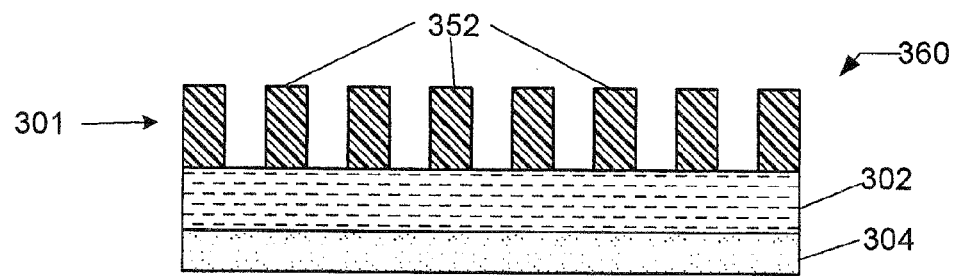
Figure 3G:
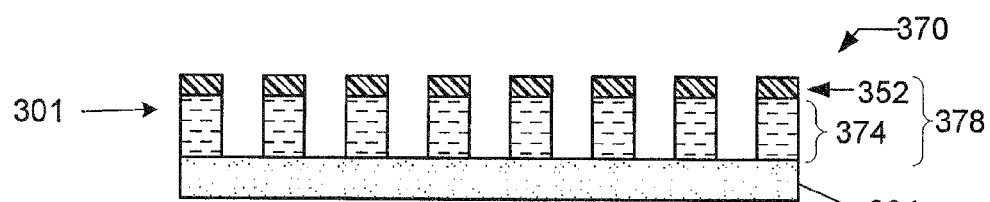
Figure 3H:
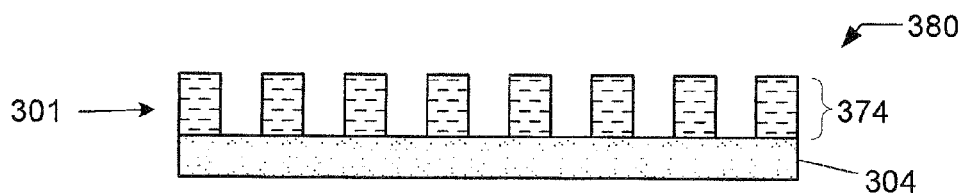

FIGS. 3A, 3B, 3C, 3D, 3E, 3F, 3G, and 3H are schematic representations of a integration operations for a self-aligned quadruple patterning (SAQP) scheme here FIG. 3A is a schematic representation 300 of providing a substrate having a patterned layer and the patterned layer comprises a first mandrel and an underlying layer. FIG. 3B is a schematic representation 310 of an integration operation for performing a first spacer reactive ion etch (RIE) process on the first conformal layer. FIG. 3C is a schematic representation 320 of an integration operation for performing a first mandrel pull process. FIG. 3D is a schematic representation 340 of an integration operation for performing a second conformal spacer deposition. FIG. 3E is a schematic representation 350 of an integration operation for performing a second RIE process on the second conformal layer. FIG. 3F is a schematic representation 360 of an integration operation for performing a second mandrel pull process. FIG. 3G is a schematic representation 370 of an integration operation for transferring the second spacer pattern into the underlying layer. FIG. 3H is a schematic representation 380 of an integration operation for an optional cleaning process where the remaining portion of the second mandrel is removed.

Figure 4A:
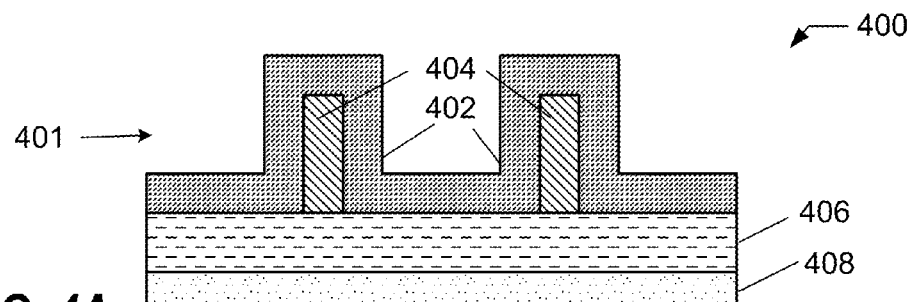
FIGS. 4A, 4B, 4C, 4D, 4E, 4F, and 4G depict schematic representations of integration operations to perform another SAQP scheme.
Figure 4B:
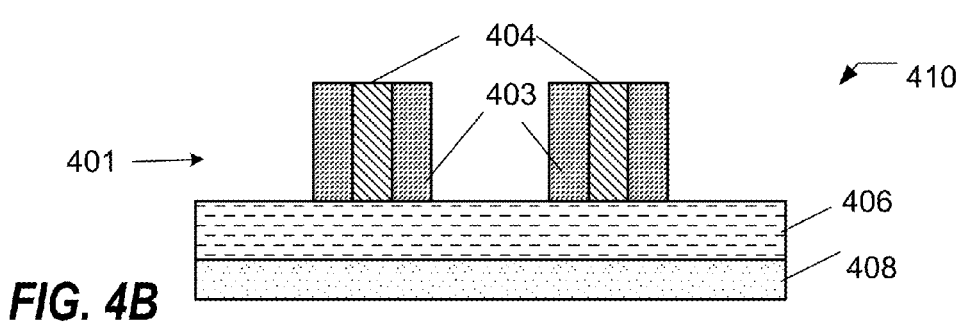
Figure 4C:
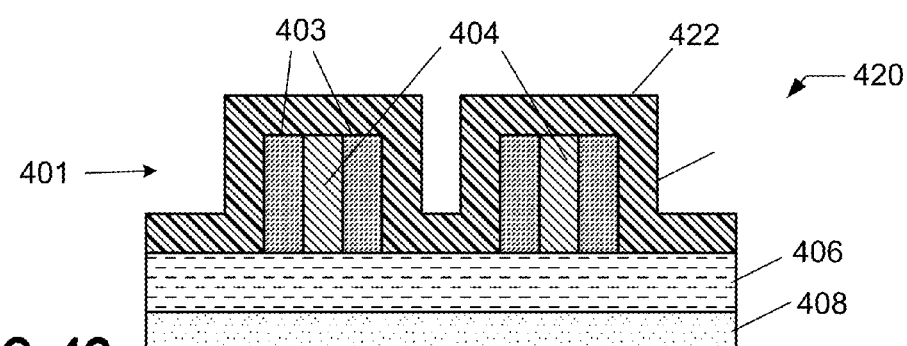
Figure 4D:
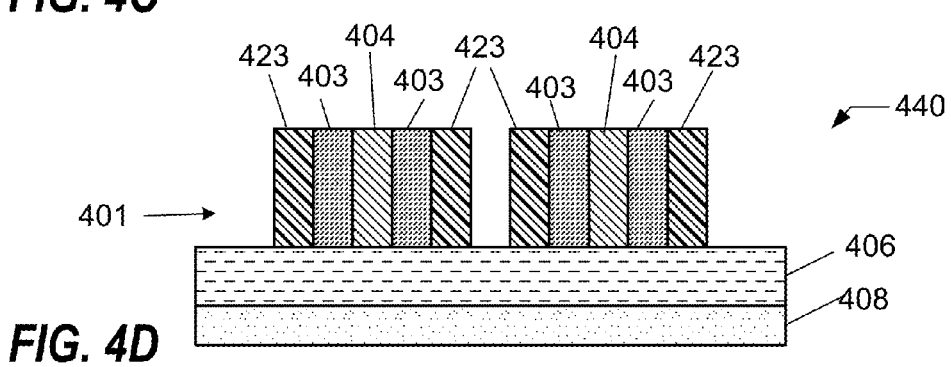
Figure 4E:
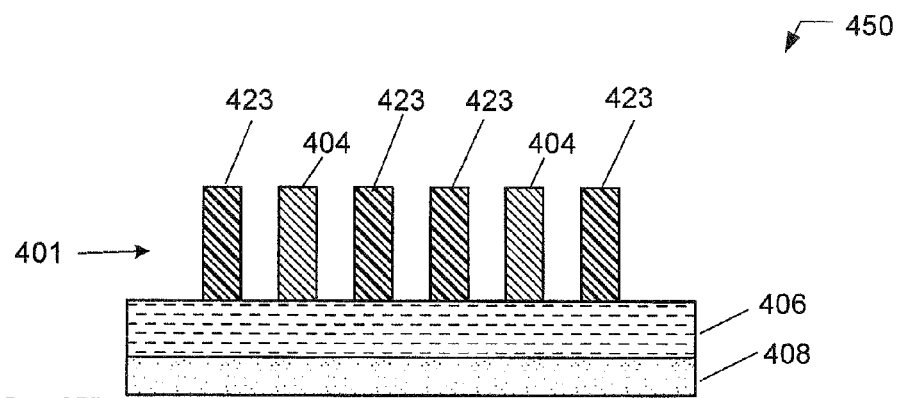
Figure 4F:
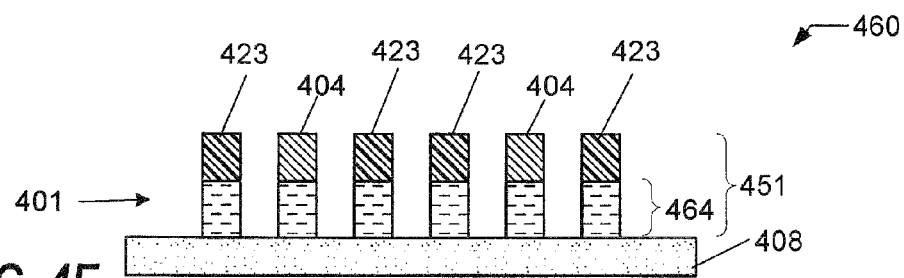
Figure 4G:
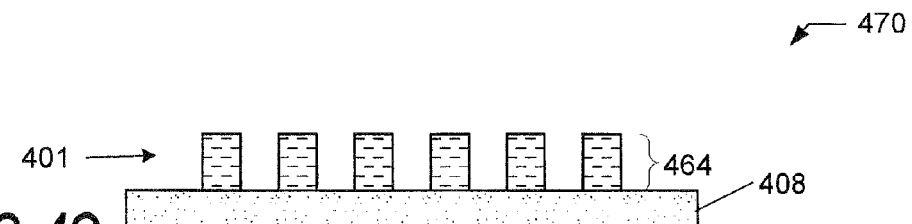

FIGS. 4A, 4B, 4C, 4D, 4E, 4F, and 4G depicts a schematic representation of integration operations to perform another SAQP scheme. FIG. 4A is a schematic representation 400 of an integration operation for providing a substrate having a different patterned layer where the patterned layer comprises a mandrel and an underlying layer. FIG. 4B is a schematic representation 410 of an integration operation for performing a first spacer RIE process on the first conformal layer. FIG. 4C is a schematic representation 420 of an integration operation for performing a second conformal spacer deposition. FIG. 4D is a schematic representation 440 of an integration operation for a second RIE process on the second conformal layer. FIG. 4E is a schematic representation 450 of an integration operation for performing a first spacer pattern pull. FIG. 4F is a schematic representation 460 of an integration operation for transferring the pattern into the underlying layer, the pattern using two different masks comprising the mandrel and the second spacer pattern. FIG. 4G is a schematic representation 470 of an integration operation for an optional cleaning process where the remaining portions of the mandrel and second spacer pattern are removed.

One or more of the methods for performing material processing to achieve high density patterning described above may be performed utilizing a processing system such as those described in FIG. 5 through 11 as described below. However, the methods discussed are not to be limited in scope by this exemplary presentation. Other method for performing material processing to achieve higher densities can also be used.

Figure 5:
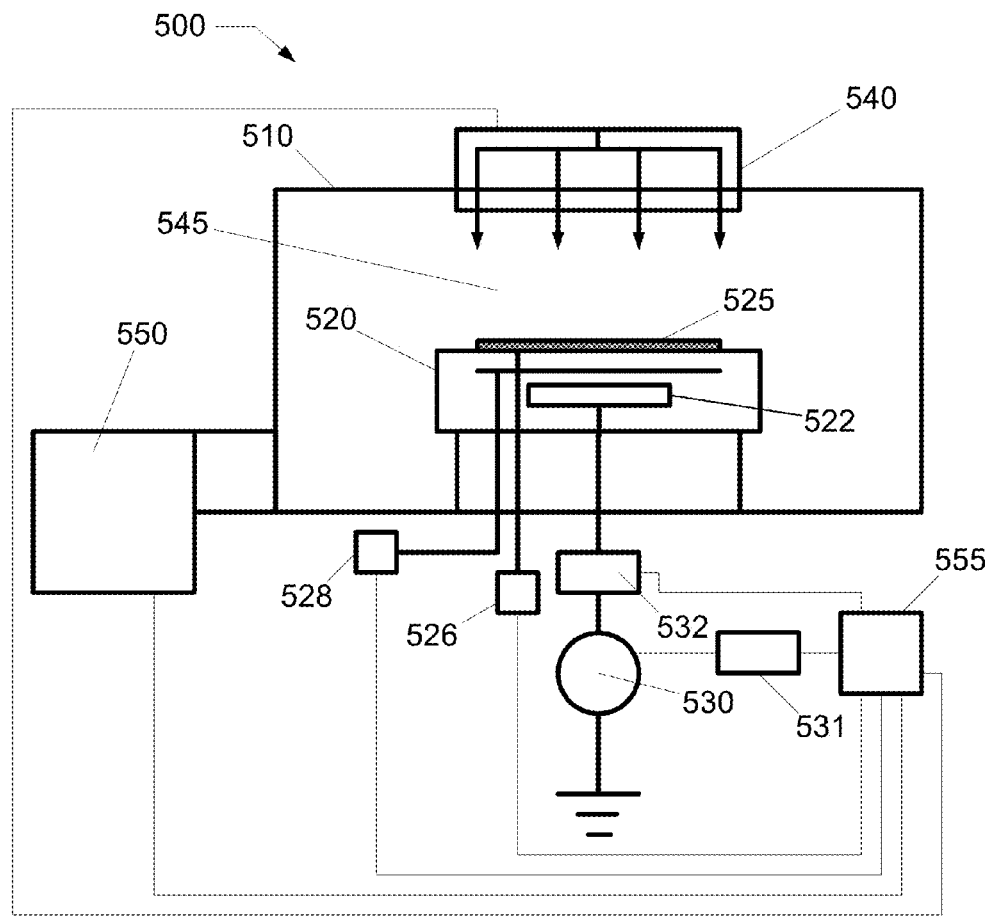
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
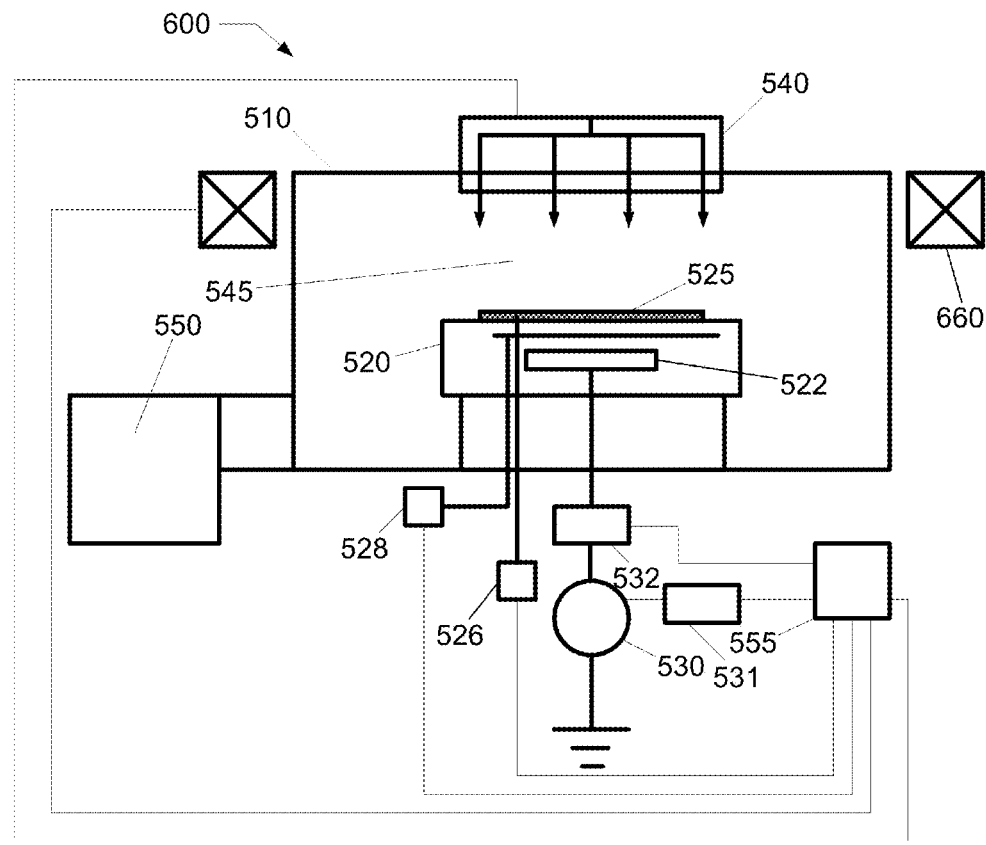
FIG. 6 shows a schematic representation of a plasma processing system according to another embodiment.
Figure 7:
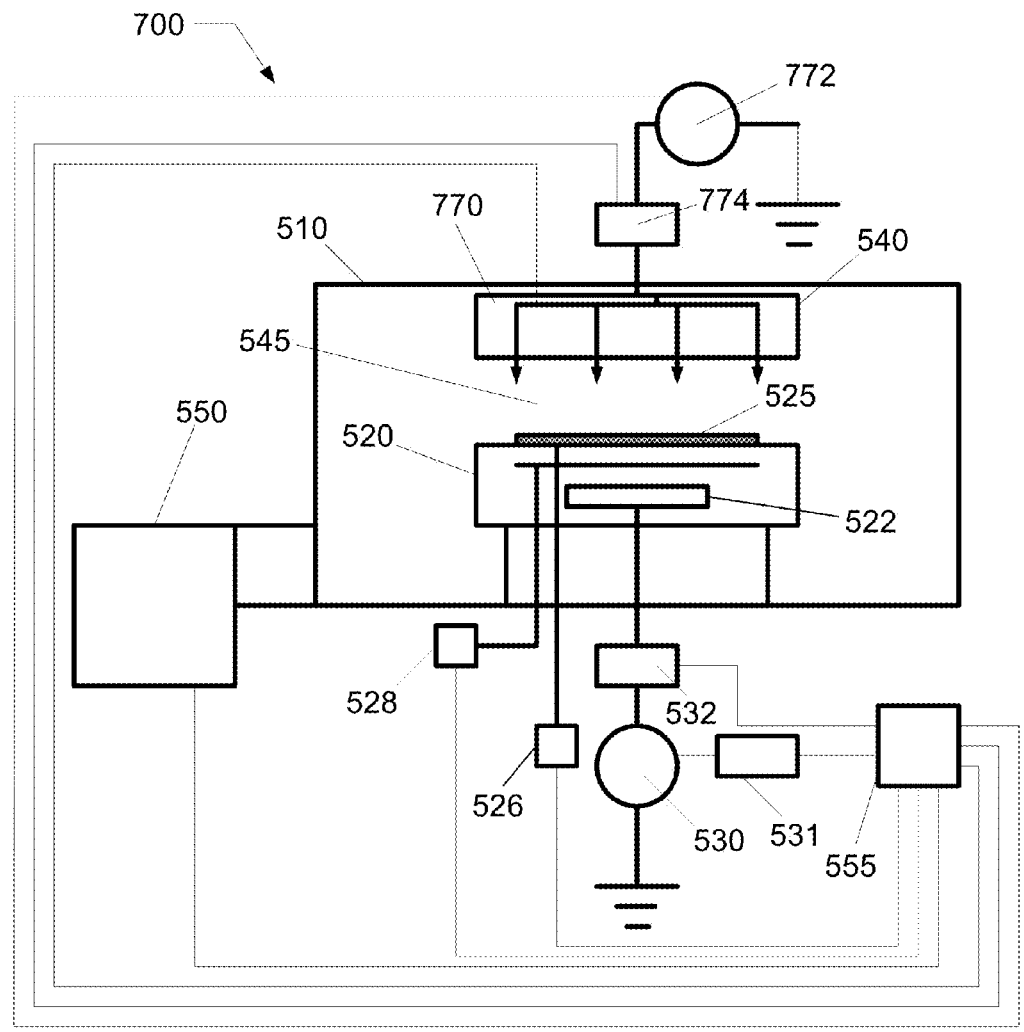
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
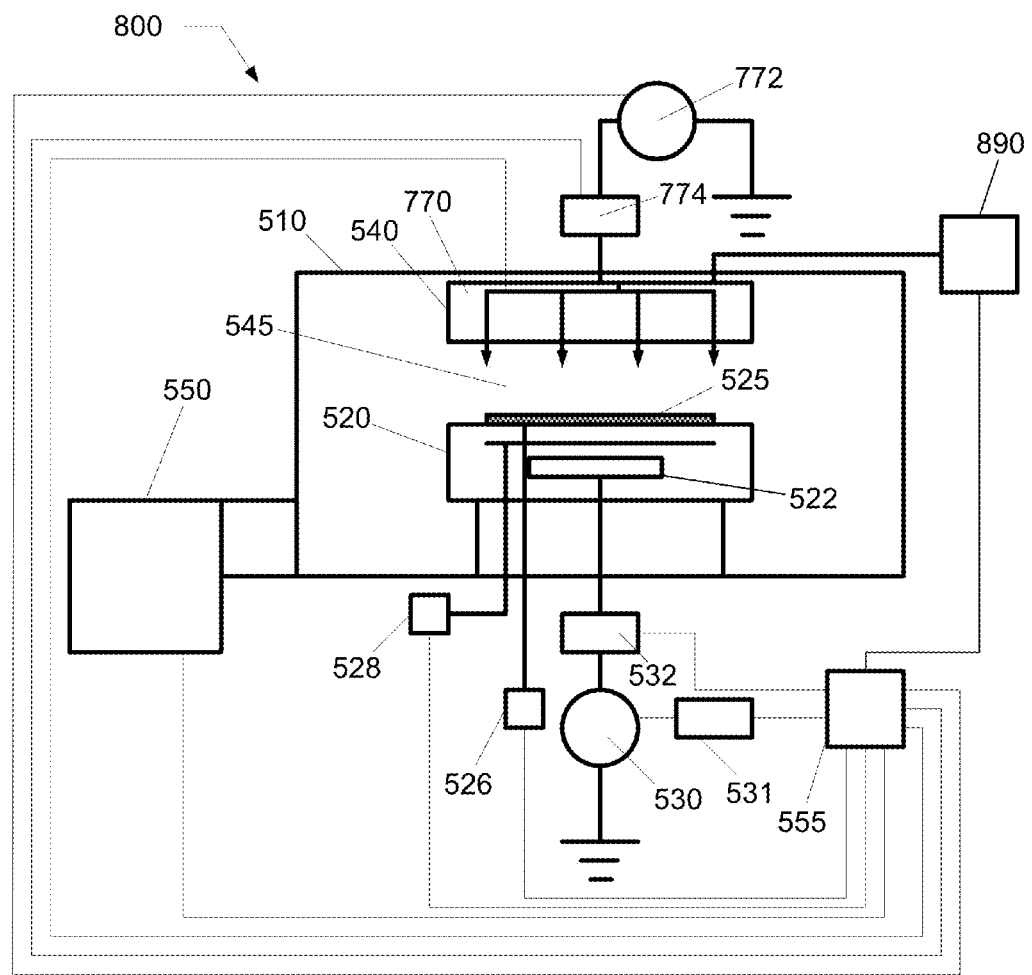
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
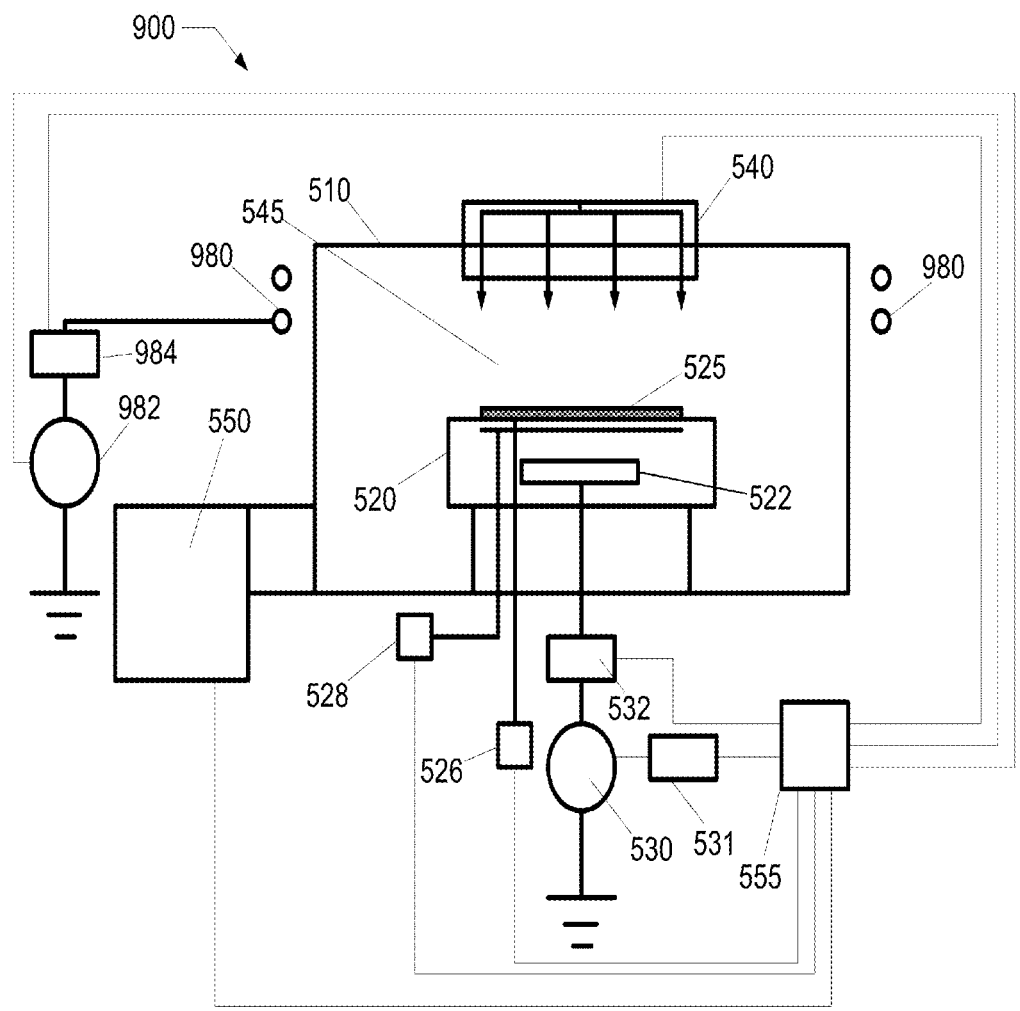
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
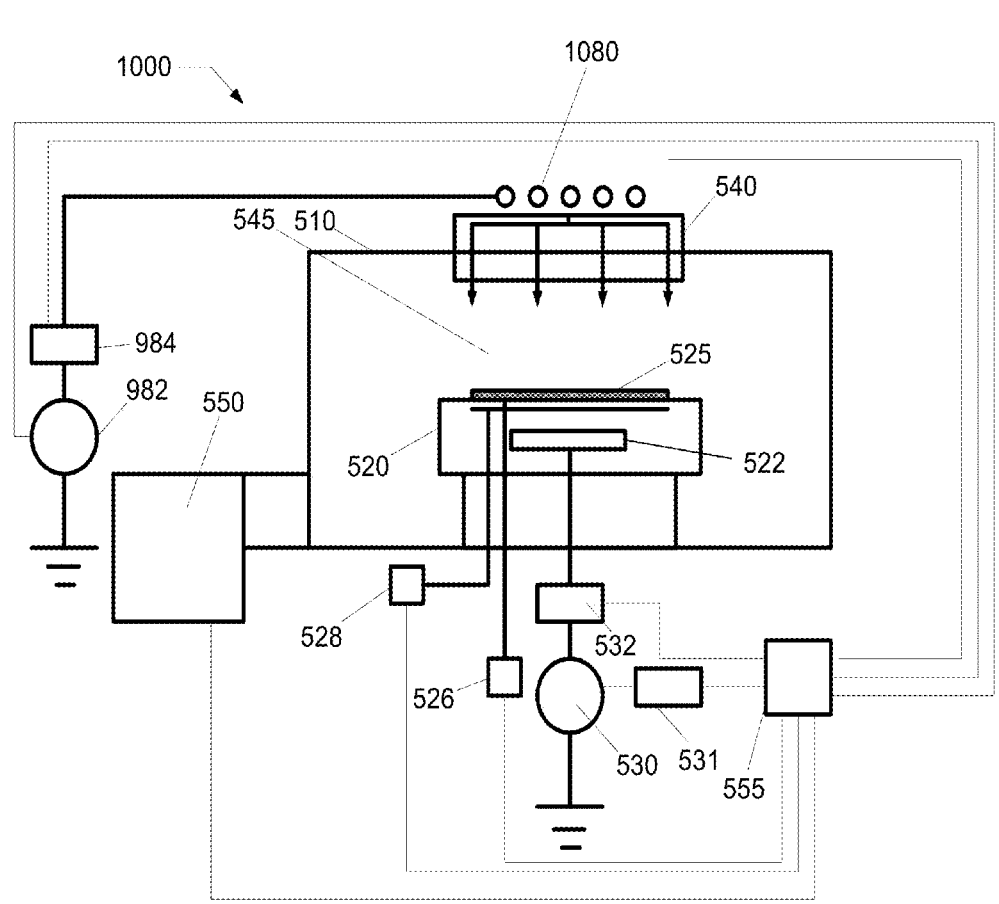
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
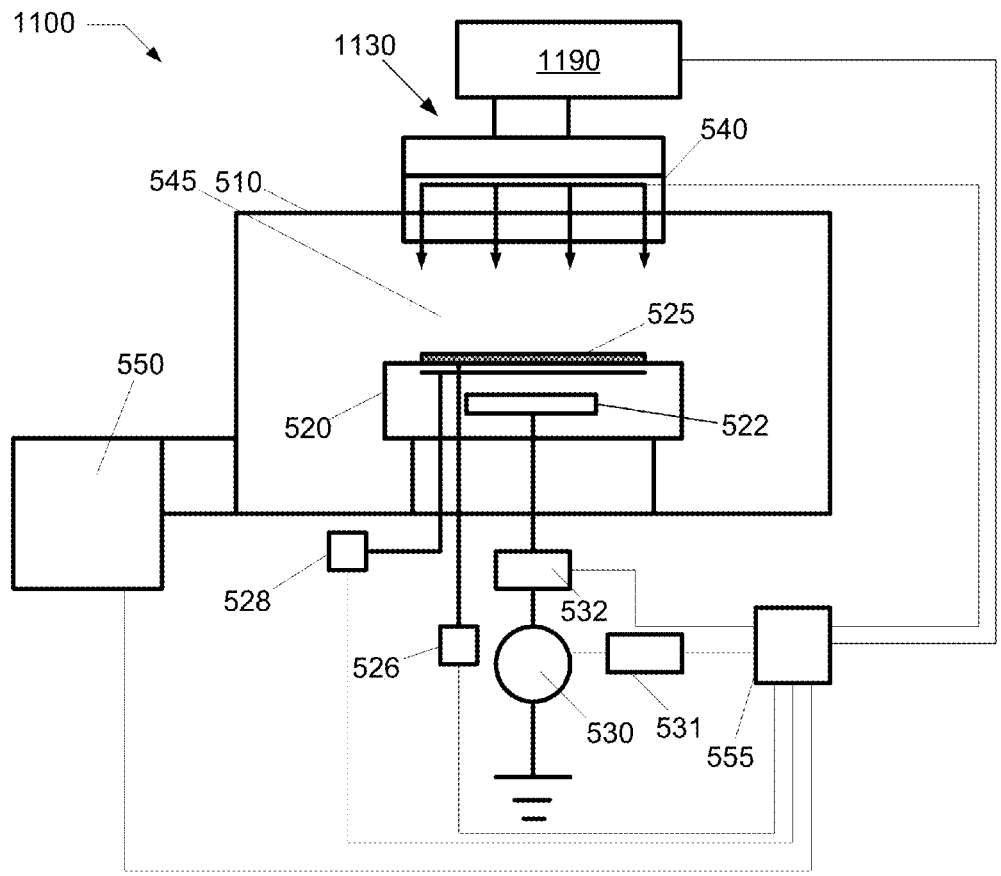
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Figure 12:
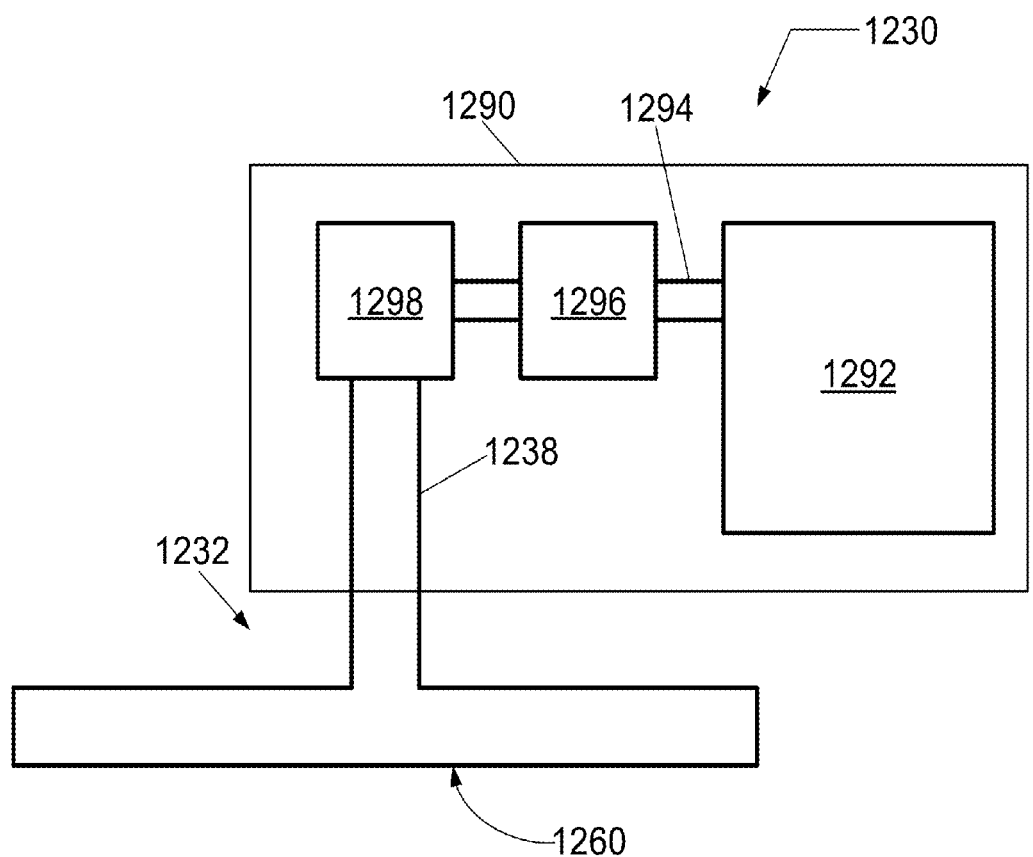
FIG. 12 depicts a cross-sectional view of a plasma source in accordance with one embodiment.

Referring now to FIG. 12, a schematic representation of a SWP source 1230 is provided according to an embodiment. The SWP source 1230 comprises an electromagnetic (EM) wave launcher 1232 configured to couple EM energy in a desired EM wave mode to a plasma by generating a surface wave on a plasma surface 1260 of the EM wave launcher 1232 adjacent plasma. Furthermore, the SWP source 1230 comprises a power coupling system 1290 coupled to the EM wave launcher 1232, and configured to provide the EM energy to the EM wave launcher 1232 for forming the plasma.

The EM wave launcher 1232 includes a microwave launcher configured to radiate microwave power into plasma processing region 545 (see FIG. 11). The EM wave launcher 1232 is coupled to the power coupling system 1290 via coaxial feed 1238 through which microwave energy is transferred. The power coupling system 1290 includes a microwave source 1292, such as a 2.45 GHz microwave power source. Microwave energy generated by the microwave source 1292 is guided through a waveguide 1294 to an isolator 1296 for absorbing microwave energy reflected back to the microwave source 1292. Thereafter, the microwave energy is converted to a coaxial TEM (transverse electromagnetic) mode via a coaxial converter 1298.

A tuner may be employed for impedance matching, and improved power transfer. The microwave energy is coupled to the EM wave launcher 1232 via the coaxial feed 1238, wherein another mode change occurs from the TEM mode in the coaxial feed 1238 to a TM (transverse magnetic) mode. Additional details regarding the design of the coaxial feed 1238 and the EM wave launcher 1232 can be found in U.S. Pat. No. 5,024,716, entitled "Plasma processing apparatus for etching, ashing, and film-formation"; the content of which is herein incorporated by reference in its entirety.

Figure 13A:
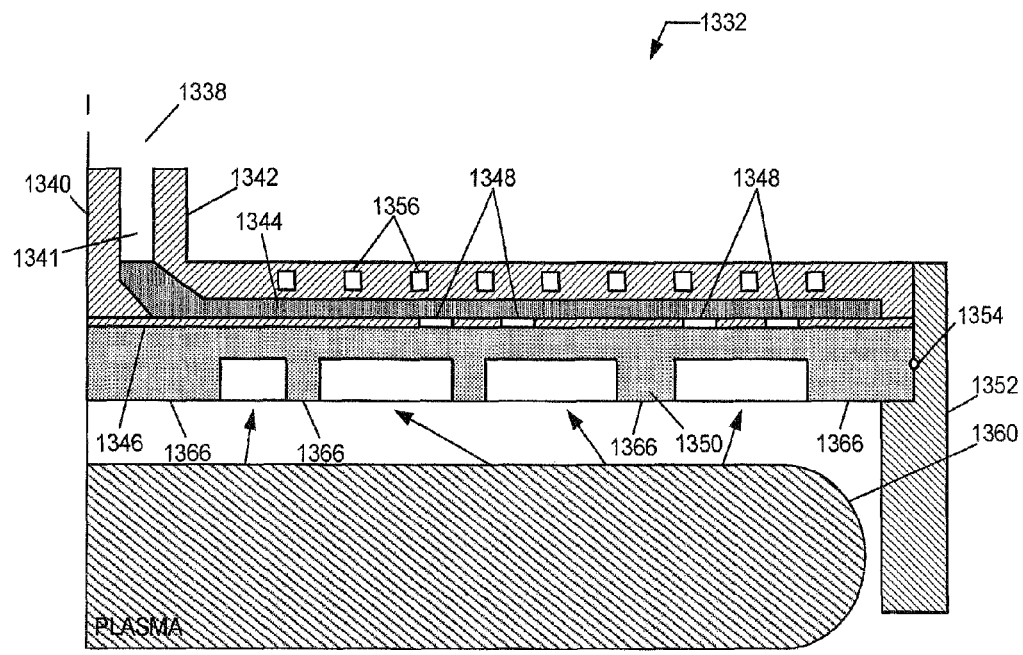
FIGS. 13A and 13B depict a cross-sectional view and bottom view of a plasma source in accordance with another embodiment.
Figure 13B:
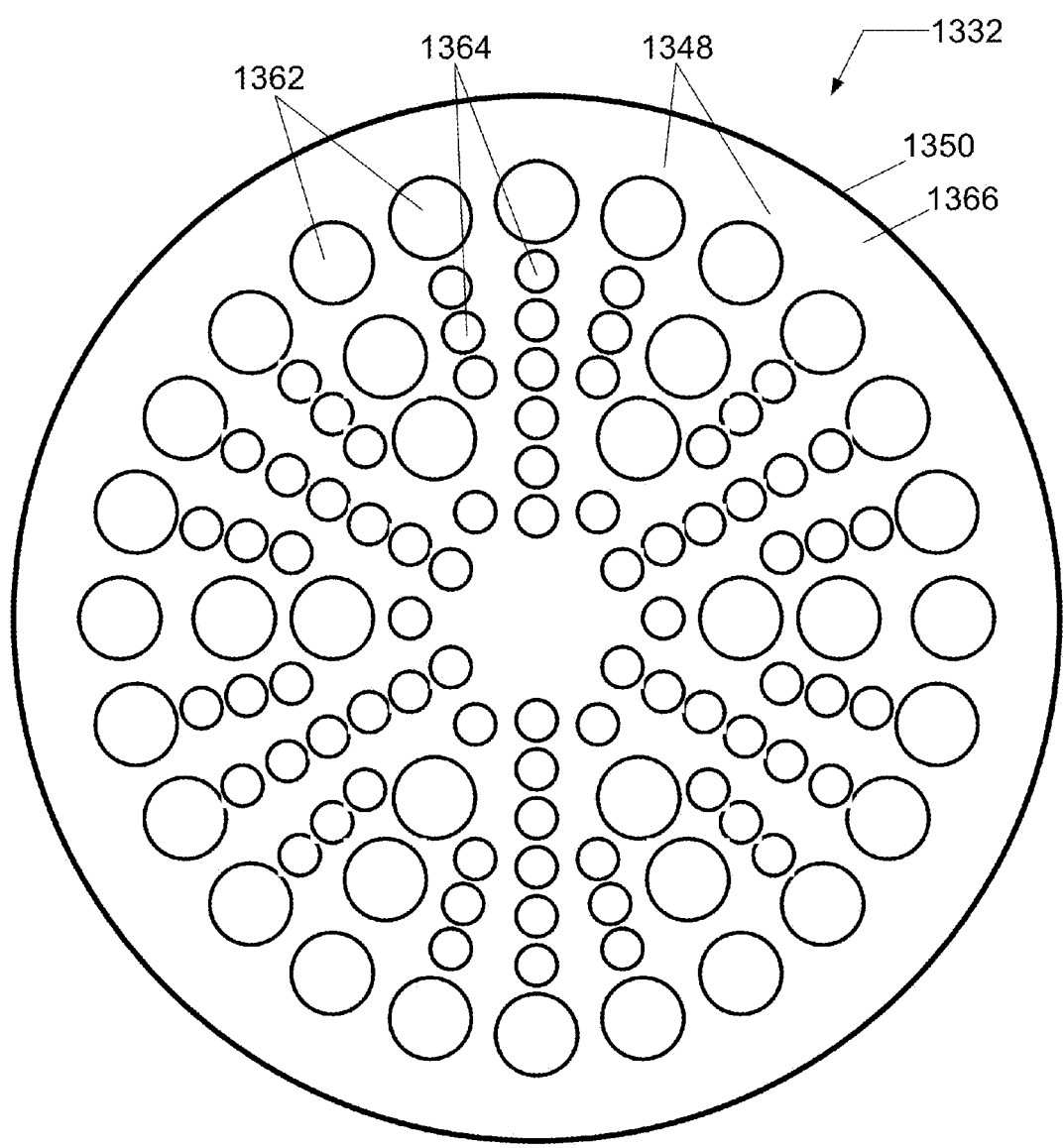

Referring now to FIGS. 13A and 13B, a schematic cross-sectional view and a bottom view, respectively, of an EM wave launcher 1332 are provided according to one embodiment. The EM wave launcher 1332 comprises a coaxial feed 1338 having an inner conductor 1340, an outer conductor 1342, and insulator 1341, such as an air gap, and a slot antenna 1346 having a plurality of slots 1348 coupled between the inner conductor 1340 and the outer conductor 1342 as shown in FIG. 13A. The plurality of slots 1348 permits the coupling of EM energy from a first region above the slot antenna 1346 to a second region below the slot antenna 1346, wherein plasma is formed adjacent a plasma surface 1360 on the EM wave launcher 1332. The EM wave launcher 1332 may further comprise a slow wave plate 1344, and a resonator plate 1350.

The number, geometry, size, and distribution of the slots 1348 are all factors that can contribute to the spatial uniformity of the plasma formed in the plasma processing region 545 (see FIG. 11). Thus, the design of the slot antenna 1346 may be used to control the spatial uniformity of the plasma in the plasma processing region 545 (see FIG. 11).

As shown in FIG. 13A, the EM wave launcher 1332 may comprise a fluid channel 1356 that is configured to flow a temperature control fluid for temperature control of the EM wave launcher 1332. Although not shown, the EM wave launcher 1332 may further be configured to introduce a process gas through the plasma surface 1360 to the plasma. Although not shown, a gas distribution system, such as the gas distribution system (540) of FIG. 11, may be connected to the EM wave launcher 1332 and/or the chamber wall 1352 for introducing a process gas into the process chamber.

Referring still to FIG. 13A, the EM wave launcher 1332 may be coupled to an upper chamber portion of a plasma processing system, wherein a vacuum seal can be formed between an upper chamber wall 1352 and the EM wave launcher 1332 using a sealing device 1354. The sealing device 1354 can include an elastomer O-ring; however, other known sealing mechanisms may be used.

In general, the inner conductor 1340 and the outer conductor 1342 of the coaxial feed 1338 comprise a conductive material, such as a metal, while the slow wave plate 1344 and the resonator plate 1350 comprise a dielectric material. In the latter, the slow wave plate 1344 and the resonator plate 1350 preferably comprise the same material; however, different materials may be used. The material selected for fabrication of the slow wave plate 1344 is chosen to reduce the wavelength of the propagating electromagnetic (EM) wave relative to the corresponding free-space wavelength, and the dimensions of the slow wave plate 1344 and the resonator plate 1350 are chosen to ensure the formation of a standing wave effective for radiating EM energy into the plasma processing region 545 (see FIG. 11).

The slow wave plate 1344 and the resonator plate 1350 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1350 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1350 can be fabricated from alumina ($Al_2O_3$), or sapphire.

Plasma uniformity and plasma stability may remain as challenges for the practical implementation of a SWP source as described above. In the latter, the standing wave at the resonator plate-plasma interface, i.e., at the plasma surface 1360, may be prone to mode jumps as plasma parameters shift.

As shown in FIGS. 13A and 13B, the EM wave launcher 1332 may be fabricated with a first recess configuration 1362 formed in the plasma surface 1360 and optionally a second recess configuration 1364 formed in the plasma surface 1360 according to one embodiment.

The first recess configuration 1362 may comprise a first plurality of recesses. Each recess in the first recess configuration 1362 may comprise a unique indentation or dimple formed within the plasma surface 1360. For example, a recess in the first recess configuration 1362 may comprise a cylindrical geometry, a conical geometry, a frusto-conical geometry, a spherical geometry, an aspherical geometry, a rectangular geometry, a pyramidal geometry, or any arbitrary shape. The first recess configuration 1362 may comprise recesses characterized by a first size (e.g., latitudinal dimension (or width), and/or longitudinal dimension (or depth)).

The second recess configuration 1364 may comprise a plurality of recesses. Each recess in the second recess configuration 1364 may comprise a unique indentation or dimple formed within the plasma surface 1360. For example, a recess in the second recess configuration 1364 may comprise a cylindrical geometry, a conical geometry, a frusto-conical geometry, a spherical geometry, an aspherical geometry, a rectangular geometry, a pyramidal geometry, or any arbitrary shape. The second recess configuration 1364 may comprise recesses characterized by a second size (e.g., latitudinal dimension (or width), and/or longitudinal dimension (or depth)). The first size of the recesses in the first recess configuration 1362 may or may not be the same as the second size of the recesses in the second recess configuration 1364. For instance, the second size may be smaller than the first size.

As shown in FIGS. 13A and 13B, the resonator plate 1350 comprises a dielectric plate having a plate diameter and a plate thickness. Therein, the plasma surface 1360 on resonator plate 1350 comprises a planar surface 1366 within which the first recess configuration 1362 and the second recess configuration 1364 are formed. Alternatively, the resonator plate 1350 comprises a non-planar geometry or an arbitrary geometry. Therein, the plasma surface 1360 may comprise a non-planar surface within which the first recess configuration and the second recess configuration are formed (not shown). For example, the non-planar surface may be concave, or convex, or a combination thereof.

The propagation of EM energy in the resonator plate 1350 may be characterized by an effective wavelength ($\lambda$) for a given frequency of EM energy and dielectric constant for the resonator plate 1350. The plate thickness may be an integer number of quarter wavelengths (n $\lambda/4$, where n is an integer greater than zero) or an integer number of half wavelengths (m $\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1362 may comprise a first plurality of cylindrical recesses, wherein each of the first plurality of cylindrical recesses is characterized by a first depth and a first diameter. As shown in FIG. 13B, the first recess configuration 1362 is located near an outer region of the plasma surface 1360.

The first diameter may be an integer number of quarter wavelengths (n $\lambda/4$, where n is an integer greater than zero), or an integer number of half wavelengths (m $\lambda/2$, where m is an integer greater than zero), or a non-integral fraction of the effective wavelength. Additionally, a first difference between the plate thickness and the first depth may be an integer number of quarter wavelengths (n $\lambda/4$, where n is an integer greater than zero), or an integer number of half wavelengths (m $\lambda/2$, where m is an integer greater than zero), or a non-integral fraction of the effective wavelength. For instance, the first diameter may be about half the effective wavelength ($\lambda/2$), and the first difference between the plate thickness and the first depth may be about half the effective wavelength ($\lambda/2$) or about quarter the effective wavelength ($\pi/4$). Additionally, for instance, the plate thickness may be about half the effective wavelength ($\lambda/2$) or greater than half the effective wavelength ($>\lambda/2$).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 1362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

As another example, the second recess configuration 1364 may comprise a second plurality of cylindrical recesses, each of the second plurality of cylindrical recesses being characterized by a second depth and a second diameter. As shown in FIG. 13B, the second recess configuration 1364 is located near an inner region of the plasma surface 1360.

The second diameter may be an integer number of quarter wavelengths (n λ/4, where n is an integer greater than zero), or an integer number of half wavelengths (m λ/2, where m is an integer greater than zero), or a non-integral fraction of the effective wavelength. Additionally, a second difference between the plate thickness and the second depth may be an integer number of quarter wavelengths (n λ/4, where n is an integer greater than zero), or an integer number of half wavelengths (m λ/2, where m is an integer greater than zero), or a non-integral fraction of the effective wavelength. For instance, the second diameter may be about half the effective wavelength (λ/2), and the second difference between the plate thickness and the second depth may be about half the effective wavelength (λ/2) or about quarter the effective wavelength (λ/4). Additionally, for instance, the plate thickness may be about half the effective wavelength (λ/2) or greater than half the effective wavelength (>λ/2).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 1364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

Referring again to FIG. 13B, a bottom view of the EM wave launcher 1332 depicted in FIG. 13A is provided. The plurality of slots 1348 in slot antenna 1346 are illustrated as if one can see through resonator plate 1350 to the slot antenna 1346. As shown in FIG. 13B, the plurality of slots 1348 may be arranged in pairs, wherein each of the pair of slots comprises a first slot oriented orthogonal to a second slot. However, the orientation of slots in the plurality of slots 1348 may be arbitrary. For example, the orientation of slots in the plurality of slots 1348 may be according to a pre-determined pattern for plasma uniformity and/or plasma stability.

The first recess configuration 1362 is substantially aligned with a first arrangement of slots in the plurality of slots 1348. Therein, at least one recess of the first recess configuration 1362 may be aligned, partially aligned, or not aligned with one or more of the plurality of slots 1348. The second recess configuration 1364 is either partly aligned with a second arrangement of slots in the plurality of slots 1348 or not aligned with the second arrangement of slots in the plurality of slots 1348. As shown in FIG. 13B, the second recess configuration 1364 is not aligned with the second arrangement of slots in the plurality of slots 1348.

As a consequence, the arrangement of the first and second recess configurations 1362, 1364 and their alignment with one or more of the plurality of slots 1348 may be optimized to control and/or improve plasma uniformity and/or stability. Additional details regarding the design of the plasma surface 1360 and the EM wave launcher 1332 can be found in pending U.S. Patent Application Publication Serial No. 2011/0057562, entitled "Stable surface wave plasma source", and filed on Sep. 8, 2009; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. For example, the integration schemes can be extended beyond the embodiments described to include octo-patterning combined or not combined with EUV processes to achieve denser patterned features. Accordingly, all such modifications are intended to be included within the scope of this invention.

The invention claimed is:

1. A method for increasing pattern density of a structure on a substrate using an integration scheme, the integration scheme configured to meet integration targets, the method comprising:
   providing a substrate having a patterned layer, the patterned layer comprising a first mandrel and an underlying layer;
   performing a first conformal spacer deposition, the deposition creating a first conformal layer above the patterned layer;
   performing a first spacer reactive ion etch (RIE) process on the first conformal layer, the RIE process creating a first spacer pattern;
   performing a first mandrel pull process, the first mandrel pull process removing the first mandrel;
   performing a second conformal spacer deposition, the deposition creating a second conformal layer;
   performing a second RIE process on the second conformal layer, the RIE process creating a second spacer pattern, the first spacer pattern being used as a second mandrel;
   performing a second mandrel pull process, the second mandrel pull process removing the first spacer pattern;
   transferring the second spacer pattern into the underlying layer;
   wherein the integration targets include patterning uniformity (uniformity), pulldown of structures (pulldown), slimming of structures (slimming), and gouging of the underlying layer (gouging), and
   wherein the first conformal layer comprises silicon nitride and the second conformal layer comprises aluminum oxide.

2. The method of claim 1 further comprising:
   controlling selected two or more integration operating variables in two or more steps involving deposition processes, RIE processes, pull processes, and pattern transfer process of the integration scheme.

3. The method of claim 2 wherein the first mandrel comprises silicon, the underlying layer comprises a TiO2 or Al2O3, or thin oxide atomic layer deposition material oxide.

4. The method of claim 3 wherein the first spacer RIE process is performed with a first spacer pulldown and a second spacer pulldown of less than 10 nm.

5. The method of claim 4 wherein the spacer RIE process uses a high density plasma with low plasma potential to limit pulldown due to ion impingement on corners of the first spacer pattern and the second spacer pattern.

6. The method of claim 5 wherein the spacer RIE process uses an inductively coupled plasma (ICP) source or a capacitively coupled plasma (CCP) source with pulsing capability.

7. The method of claim 6 wherein the first mandrel pull process is performed with a high density plasma source configured to yield a minimum critical dimension (CD) slimming of the first spacer pattern to 3 nm or less and configured to control gouging of the underlying layer in a range from 0.05 nm to 5.00 nm.

8. The method of claim 7 wherein the first mandrel pull process utilized a mixture of hydrogen bromide and oxygen or chlorine and helium, and wherein the second mandrel pull process utilized CH3F/O2/Ar, CH3F/H2/Ar or CH3F/H2/He.

9. The method of claim 1 wherein the uniformity is in a range of −5% to +5% of a mean critical dimension of the structure, the pulldown is in a range of 0.5 to 15.0 nm, slimming is in a range from 0.5 to 3.0 nm, and gouging is in a range from 0.05 to 5.00 nm.

10. The method of claim 9 wherein the second conformal layer comprises silicon nitride and the first mandrel pull process utilized a mixture of hydrogen bromide and oxygen or a mixture of chlorine and helium.

11. The method of claim 1 wherein the first mandrel pull process comprises an amorphous carbon layer, the underlying layer comprises TiO2 or TiN or Al2O3, or thin oxide atomic layer deposition material, and the second mandrel pull process utilized a CH3F/O2/Ar, CH3F/H2/Ar or CH3F/H2/He gas mixture.

12. A method for increasing pattern density of a structure on a substrate using an integration scheme, the integration scheme configured to meet integration targets, the method comprising:
providing a substrate in a processing chamber, the substrate having a patterned layer, the patterned layer comprising a mandrel and an underlying layer;
performing a first conformal spacer deposition using silicon nitride, the deposition creating a first conformal layer above the patterned layer;
performing a first spacer reactive ion etch (RIE) process on the first conformal layer, the RIE process creating a first spacer pattern;
performing a second conformal spacer deposition, the deposition creating a second conformal layer;
performing a second RIE process on the second conformal layer, the RIE process creating a second spacer pattern;
performing a first spacer pattern pull process, the first spacer pattern pull process removing the first spacer pattern; and
transferring a pattern into the underlying layer using two masks, the two masks comprising the mandrel and the second spacer pattern;
wherein the integration targets include patterning uniformity (uniformity), pulldown of structures (pulldown), slimming of structures (slimming), and gouging of the underlying layer (gouging), and
wherein the first mandrel comprises silicon.

13. The method of claim 12 further comprising:
controlling selected two or more integration operating variables in two or more steps involving deposition processes, RIE processes, pull processes, and pattern transfer process of the integration scheme.

14. The method of claim 12 wherein the underlying layer comprises a first layer of thin oxide and a second layer of titanium nitride, and the first conformal spacer deposition comprises silicon nitride.

15. The method of claim 14 wherein the second conformal spacer deposition comprises Al2O3, and the gases of the first RIE process comprise CH3F/O2/Ar or CH3/H2/Ar or CH3/H2/He.

16. The method of claim 12 wherein the uniformity is in the range of −5% to +5% of a mean critical dimension of the structure, the pulldown of a structure is in a range of 0.5 to 15.0 nm.

17. The method of claim 12 wherein slimming is in a range from 0.5 to 3.0 nm and gouging is in a range from 0.05 to 5.00 nm.

18. The method of claim 12 wherein the first conformal spacer deposition is Al2O3, the second conformal spacer deposition is TiO2, and the gases of the first RIE process comprise BCl3, CF4, Ar and the gases of the second RIE process comprise C4F8/O2 with a carrier gas that is Ar or He or C4F6/O2 with a carrier gas that is Ar or He.

19. The method of claim 12 wherein all manufacturing processes of the integration scheme are performed using the processing chamber.

* * * * *